(12) United States Patent
Morino et al.

(10) Patent No.: US 11,615,722 B2
(45) Date of Patent: Mar. 28, 2023

(54) ELECTRONIC APPARATUS

(71) Applicant: Lenovo (Singapore) Pte. Ltd., Singapore (SG)

(72) Inventors: Takayuki Morino, Kanagawa (JP); Kenji Watamura, Kanagawa (JP); Moriyuki Tsuchihashi, Kanagawa (JP)

(73) Assignee: Lenovo (Singapore) Pte. Ltd., Singapore (SG)

(*) Notice: Subject to any disclaimer, the term of this patent is extended or adjusted under 35 U.S.C. 154(b) by 0 days.

(21) Appl. No.: 17/716,642

(22) Filed: Apr. 8, 2022

(65) Prior Publication Data
US 2022/0343808 A1 Oct. 27, 2022

(30) Foreign Application Priority Data
Apr. 22, 2021 (JP) .............................. JP2021-072471

(51) Int. Cl.
| | |
|---|---|
| G06F 3/041 | (2006.01) |
| G09F 9/30 | (2006.01) |
| H05K 5/02 | (2006.01) |
| G06F 1/16 | (2006.01) |

(52) U.S. Cl.
CPC ............ G09F 9/301 (2013.01); G06F 1/1616 (2013.01); G06F 1/1652 (2013.01); H05K 5/0226 (2013.01)

(58) Field of Classification Search
CPC .... G06F 1/1616; G06F 1/1641; G06F 1/1652; G06F 2203/04102; G09F 9/301; H05K 5/0226
See application file for complete search history.

(56) References Cited

U.S. PATENT DOCUMENTS

| | | | | |
|---|---|---|---|---|
| 9,173,288 | B1* | 10/2015 | Kim | G06F 1/1681 |
| 10,082,839 | B1* | 9/2018 | Turchin | H05K 5/0017 |
| 10,133,303 | B2* | 11/2018 | Park | G06F 1/1681 |
| 10,180,701 | B2* | 1/2019 | Nakamura | G06F 1/166 |
| 10,185,355 | B2* | 1/2019 | Watamura | G06F 1/1637 |
| 10,209,746 | B2* | 2/2019 | Baek | G06F 1/1641 |
| 10,228,722 | B2* | 3/2019 | Watamura | G06F 1/1641 |
| 10,228,724 | B2* | 3/2019 | Nakamura | G06F 1/1677 |

(Continued)

FOREIGN PATENT DOCUMENTS

| | | |
|---|---|---|
| JP | 2013-243588 A | 12/2013 |
| JP | 2018-112833 A | 7/2018 |
| JP | 2021-33192 A | 3/2021 |

*Primary Examiner* — Joe H Cheng
(74) *Attorney, Agent, or Firm* — Osha Bergman Watanabe & Burton LLP

(57) ABSTRACT

An electronic apparatus includes: a first chassis; a second chassis; a hinge device connecting the first and second chassis in a relatively rotatable manner; a display having a bending region; a first plate; and a second plate. In the first posture, the bending region of the display has a bag-shaped bending shape in cross section that protrudes from end faces of the first plate and the second plate disposed to overlap each other. The electronic apparatus further has a first inclined face protruding from the end face of the first plate to be inclined gradually downward from the surface of the first plate in the protruding direction, and a second inclined face protruding from the end face of the second plate to be inclined gradually downward from the surface of the second plate in the protruding direction.

6 Claims, 11 Drawing Sheets

(56) References Cited

U.S. PATENT DOCUMENTS

| | | | |
|---|---|---|---|
| 10,274,996 B2* | 4/2019 | Lin | E05D 3/06 |
| 10,860,056 B2* | 12/2020 | Watamura | G06F 1/1643 |
| 11,194,366 B2* | 12/2021 | Cheng | G06F 1/1652 |
| 11,337,321 B2* | 5/2022 | Jia | G06F 1/1652 |
| 11,379,002 B2* | 7/2022 | Kinoshita | G06F 1/1652 |
| 11,487,329 B2* | 11/2022 | Tsuchihashi | G06F 1/1652 |
| 2013/0021762 A1* | 1/2013 | van Dijk | H05K 5/0226 |
| | | | 361/749 |
| 2014/0111954 A1* | 4/2014 | Lee | H05K 1/028 |
| | | | 361/749 |
| 2015/0241925 A1* | 8/2015 | Seo | G06F 1/1681 |
| | | | 361/679.27 |
| 2015/0366089 A1* | 12/2015 | Park | H04M 1/022 |
| | | | 361/679.01 |
| 2015/0378397 A1 | 12/2015 | Park et al. | |
| 2016/0085265 A1* | 3/2016 | Park | G06F 1/1652 |
| | | | 361/807 |
| 2018/0324964 A1 | 11/2018 | Yoo et al. | |
| 2020/0249723 A1* | 8/2020 | Mizoguchi | G06F 1/1626 |
| 2020/0275563 A1* | 8/2020 | Watamura | G06F 1/1652 |
| 2021/0124397 A1* | 4/2021 | Mizoguchi | G06F 1/1652 |
| 2021/0360800 A1* | 11/2021 | Horiuchi | G06F 1/1641 |
| 2021/0365066 A1* | 11/2021 | Kinoshita | G06F 1/1679 |
| 2021/0365072 A1* | 11/2021 | Kinoshita | G06F 1/1616 |
| 2022/0068167 A1* | 3/2022 | Park | H04M 1/0216 |
| 2022/0232729 A1* | 7/2022 | Ohyama | G06F 1/1616 |
| 2022/0338362 A1* | 10/2022 | Morino | H05K 5/0017 |

* cited by examiner

ELECTRONIC APPARATUS

CROSS-REFERENCE TO RELATED APPLICATIONS

This application claims priority to Japanese Patent Application No. 2021-72471 filed on Apr. 22, 2021, the contents of which are hereby incorporated herein by reference in their entirety.

TECHNICAL FIELD

The present disclosure relates to an electronic apparatus including a plurality of chassis that are relatively rotatably connected.

BACKGROUND

An electronic apparatus may include a flexible display such as an organic light emitting diode (OLED), and the apparatus may be configured so that not only the chassis but also the display is foldable.

SUMMARY

An electronic apparatus according to a first aspect of the present disclosure includes: a first chassis; a second chassis adjacent to the first chassis; a hinge device configured to connect the first chassis and the second chassis in a relatively rotatable manner between a first posture where the first chassis and the second chassis are stacked to overlap each other in their surface normal directions and a second posture where the first chassis and the second chassis are placed side by side in the direction perpendicular to the surface normal directions; a display that extends over the first chassis and the second chassis, and has a bending region that is bent together with a relative rotation between the first chassis and the second chassis; a first plate disposed to face an inner surface of the first chassis, the first plate having a surface, to which a rear face of the display at a region close to the first chassis relative to the bending region is fixed; and a second plate disposed to face an inner surface of the second chassis, the second plate having a surface, to which a rear face of the display at a region close to the second chassis relative to the bending region is fixed. In the first posture, the bending region of the display has a bag-shaped bending shape in cross section that protrudes from end faces of the first plate and the second plate disposed to overlap each other. The electronic apparatus further has a first inclined face protruding from the end face of the first plate to be inclined gradually downward from the surface of the first plate in the protruding direction; and a second inclined face protruding from the end face of the second plate to be inclined gradually downward from the surface of the second plate in the protruding direction.

DETAILED DESCRIPTION

Figure 1:
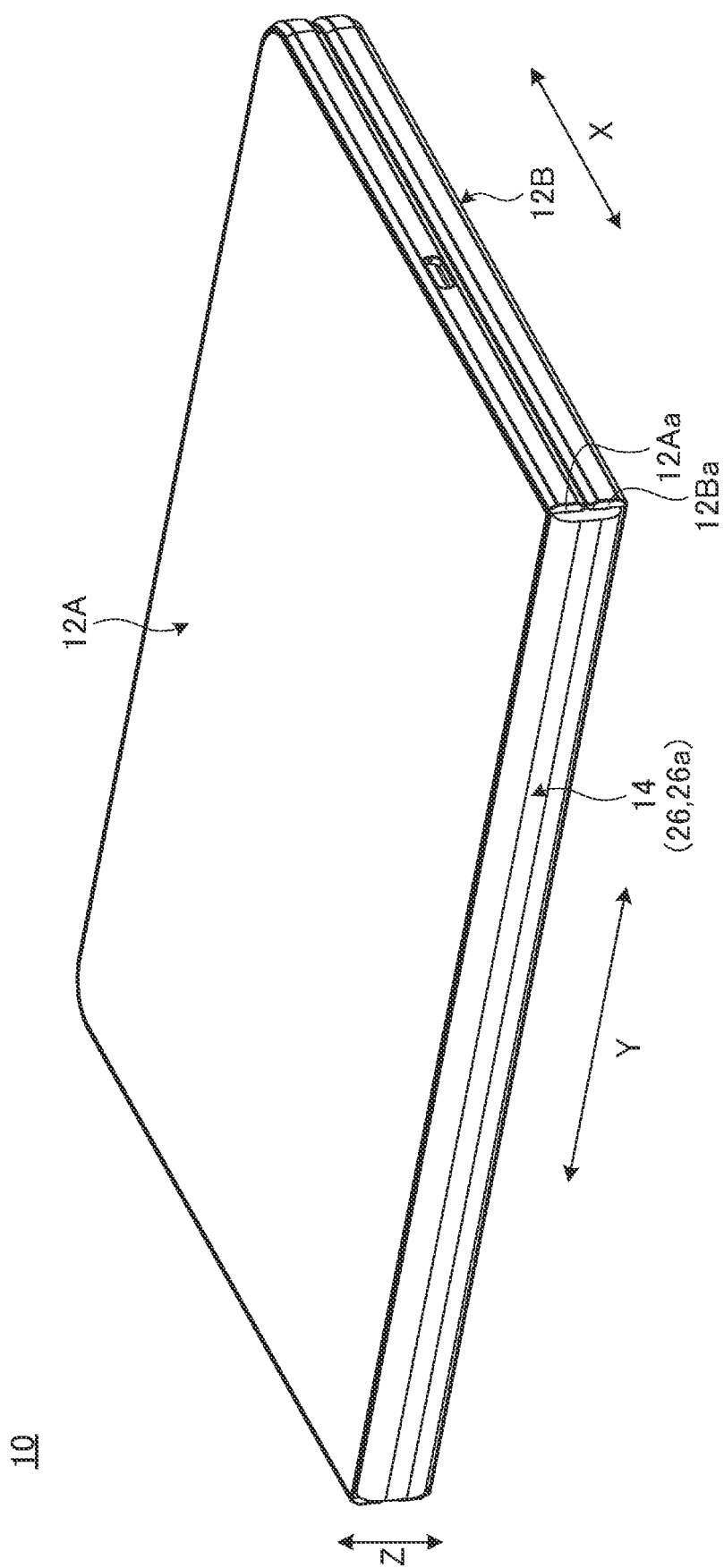
FIG. 1 is a perspective view of an electronic apparatus according to one embodiment that is closed to the 0-degree posture.

When a flexible display is bent loosely, it has a substantially U-shaped bent shape. When it is bent to be thinner from this state, the display has a bent shape that swells like a bag. This bent shape may be referred to as a bell shape, a teardrop shape, or an $\Omega$ shape. In this bent shape, the bending direction of the display's bending region is reversed near the fixed end. In this case, the display has a substantially C-shaped inward bending at the distal end and a reversed outward bending at the root.

It has been confirmed, however, that such a bag-shaped bending display may cause delamination if the radius of curvature at the outward bending is too small.

In this regard, referring to the drawings, the following describes an electronic apparatus according to the present disclosure in details by way of preferable embodiments.

Figure 2:
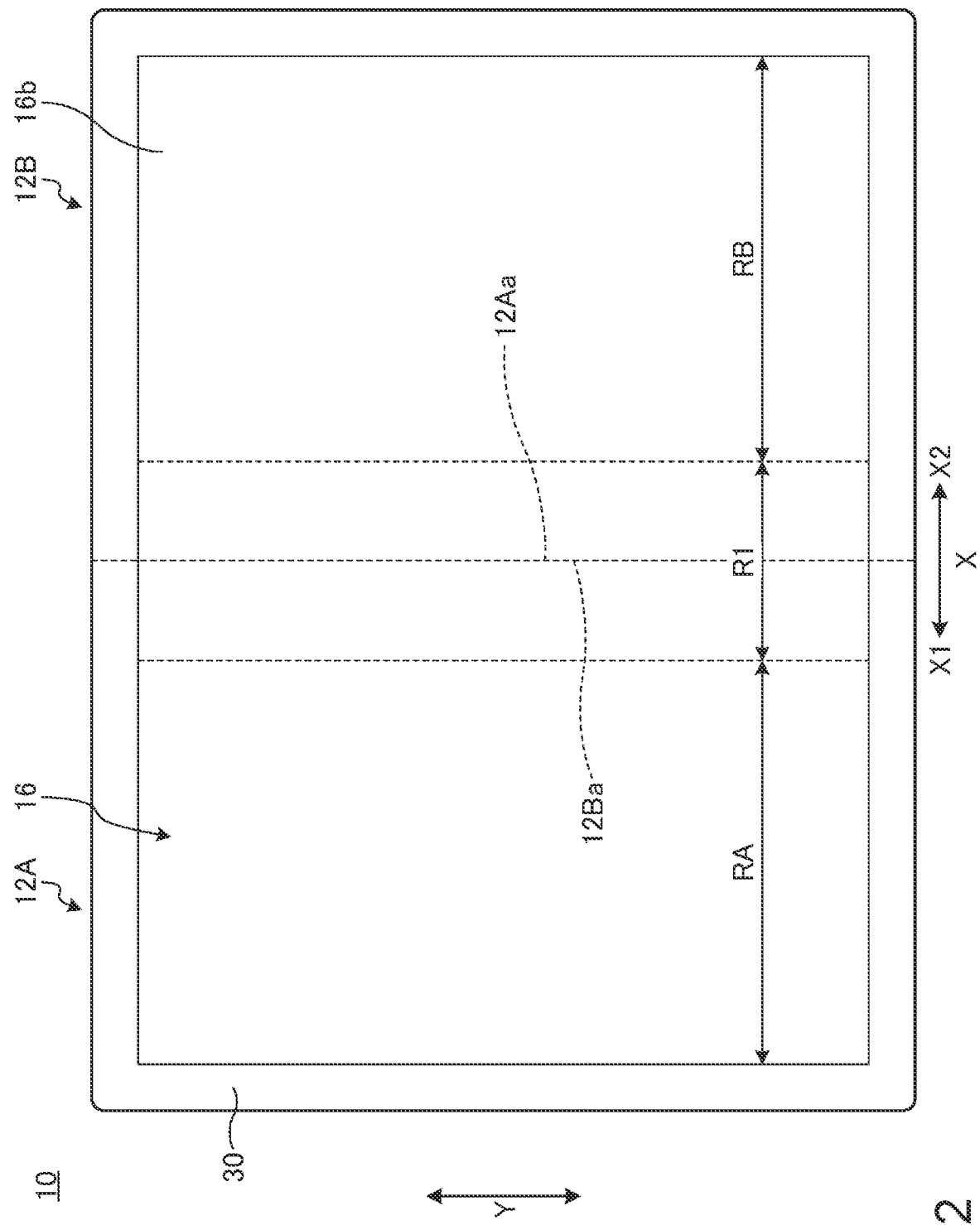
FIG. 2 is a plan view schematically illustrating the electronic apparatus of FIG. 1 that is opened to the 180-degree posture.
Figure 3:
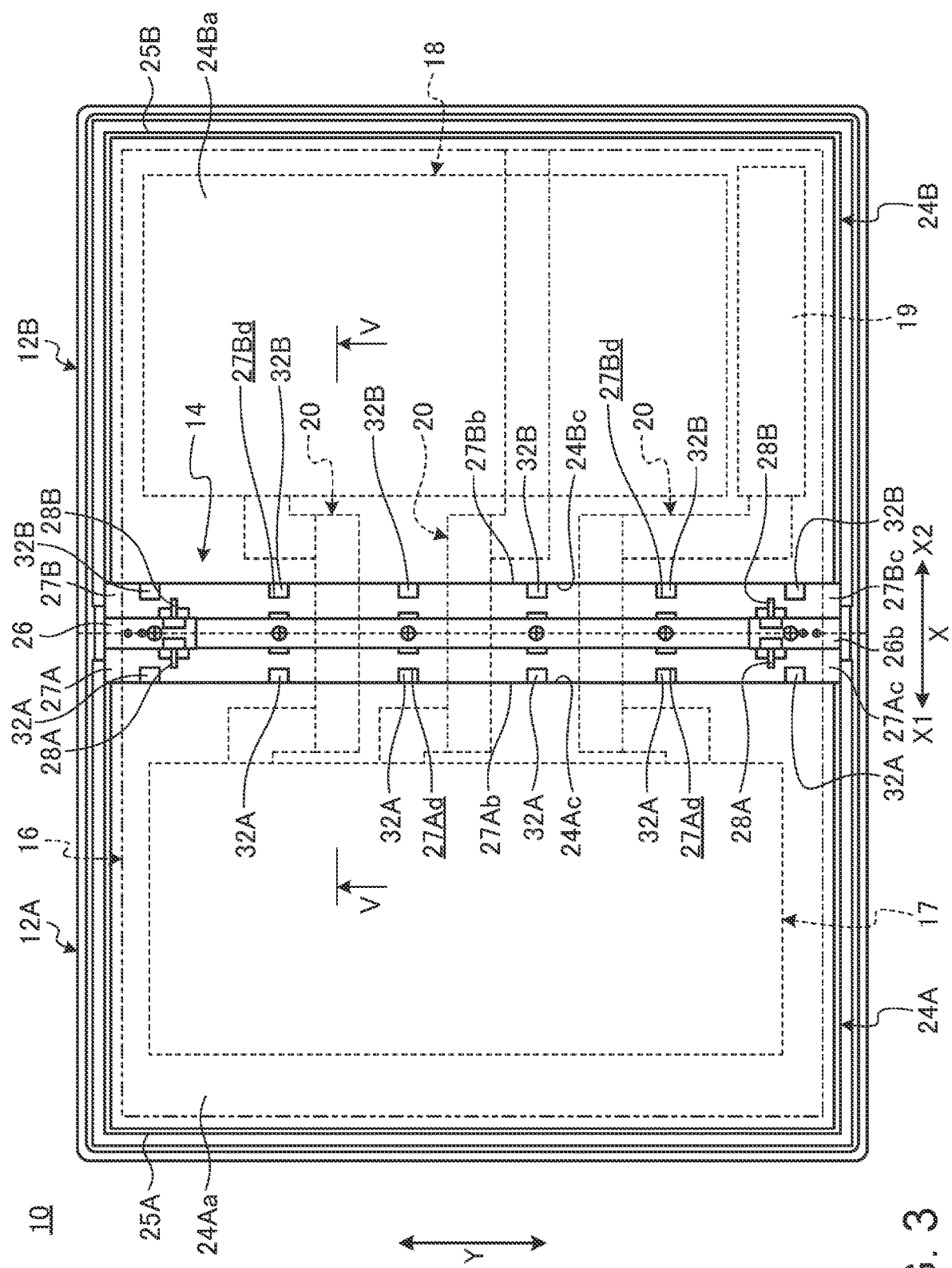
FIG. 3 is a plan view schematically illustrating the internal structure of the electronic apparatus of FIG. 2.

FIG. 1 is a perspective view of an electronic apparatus 10 according to one embodiment when the electronic apparatus 10 is closed to have a 0-degree posture. FIG. 2 is a plan view schematically illustrating the electronic apparatus 10 of FIG. 1 that is opened to a 180-degree posture. FIG. 3 is a plan view schematically illustrating the internal structure of the electronic apparatus 10 of FIG. 2.

As illustrated in FIGS. 1 to 3, the electronic apparatus 10 includes a first chassis 12A, a second chassis 12B, a hinge device 14, and a display 16. The electronic apparatus 10 of the present embodiment is described by way of an example of a tablet PC or a laptop PC that is foldable like a book. The electronic apparatus 10 may be other devices such as a mobile phone, a smartphone, and a portable game machine.

The chassis 12A and 12B are placed adjacent to each other. Each chassis 12A, 12B is a rectangular plate member having side walls standing on the three sides other than at the side (of the adjacent ends 12Aa and 12Ba) connected with the hinge device 14. In one example, the chassis 12A and 12B are metal plates made of stainless steel, magnesium, and aluminum or fiber reinforced resin plates containing reinforced fibers such as carbon fibers. The hinge device 14 connects the chassis 12A and 12B in a relatively rotatable manner. The hinge device 14 also functions as a spine member that hides the gap between the adjacent ends 12Aa, 12Ba that is formed in the 0-degree posture illustrated in FIG. 1. The display 16 extends over the chassis 12A and 12B.

As illustrated in FIG. 3, the first chassis 12A accommodates electronic components such as a motherboard 17. The motherboard 17 is a main board of the electronic apparatus 10, and electronic components such as a CPU, a communication module, and a SSD are mounted on the motherboard 17.

The second chassis 12B accommodates electronic components such as a battery device 18 and a subcard 19. The battery device 18 is a secondary cell that is a power source of the electronic apparatus 10. The subcard 19 is a board that mounts a power button and an external connector that conforms to the USB (Universal Serial Bus) standard, for example.

In one example, the chassis 12A and 12B are electrically connected with three flexible boards 20. These flexible boards connect between the motherboard 17, the display 16, the battery device 18, and the subcard 19.

For the electronic apparatus 10, the following refers to the direction of placing the chassis 12A and 12B side by side as X direction, the direction orthogonal to X direction and along the adjacent ends 12Aa and 12Ba as Y direction, and the thickness direction of the chassis 12A and 12B as Z direction. For X direction, the direction from the second chassis 12B to the first chassis 12A may be referred to as X1 direction, and the opposite direction from the first chassis 12A to the second chassis 12B may be referred to as X2 direction. For the angular posture between the chassis 12A and 12B, the following refers to the stacking state in which the chassis overlap in the surface normal direction as a 0-degree posture (see FIGS. 1 and 4C), and the state of placing the chassis side by side in the direction perpendicular to the surface normal direction (X direction) as a 180-degree posture (see FIGS. 2 and 4A). The postures between 0 degree and 180 degrees are referred to with corresponding angles. For example, the posture illustrated in FIG. 4B is called a 60-degree posture. These angles are for convenience of explanation, and the actual product may have an angular position that deviates slightly from the exact angular position indicated by the angle. The present embodiment describes the angular posture including these deviated angular positions as a 0-degree posture, for example.

Figure 4A:
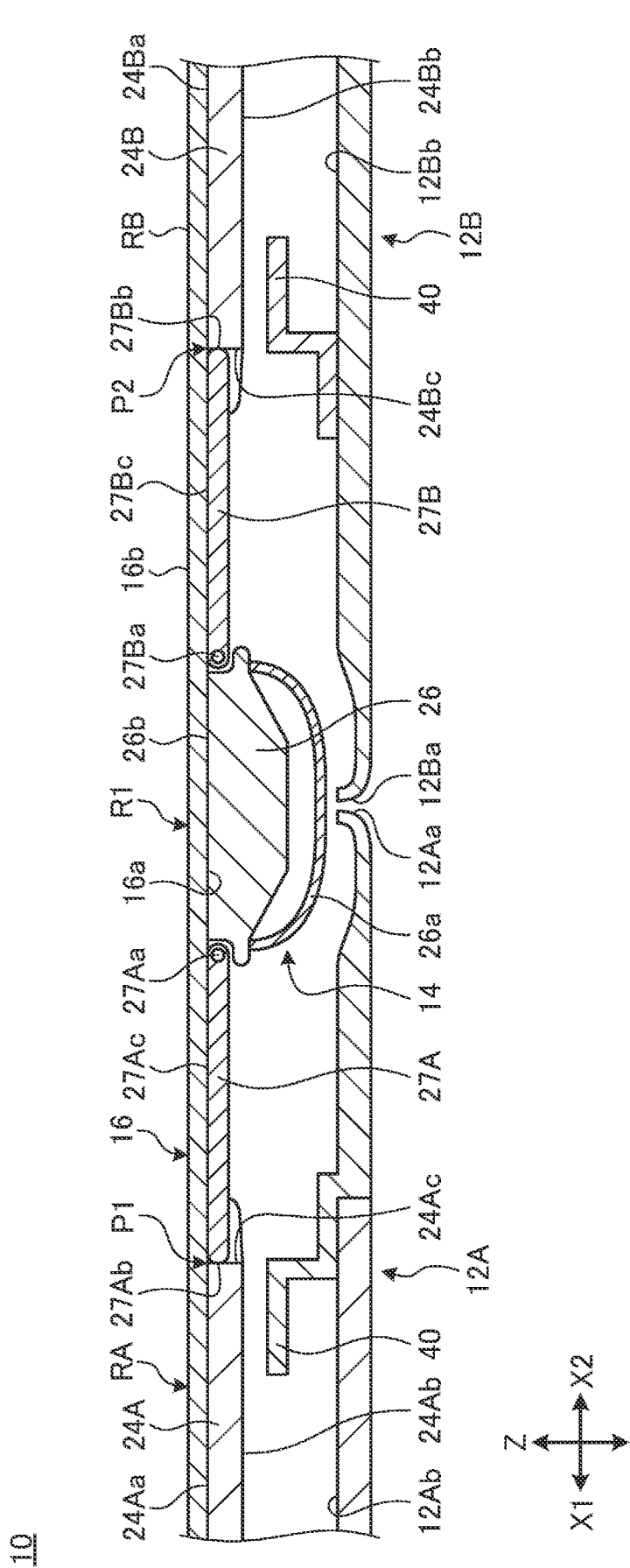
FIG. 4A is a schematic cross-sectional view of the electronic apparatus in the 180-degree posture.
Figure 4B:
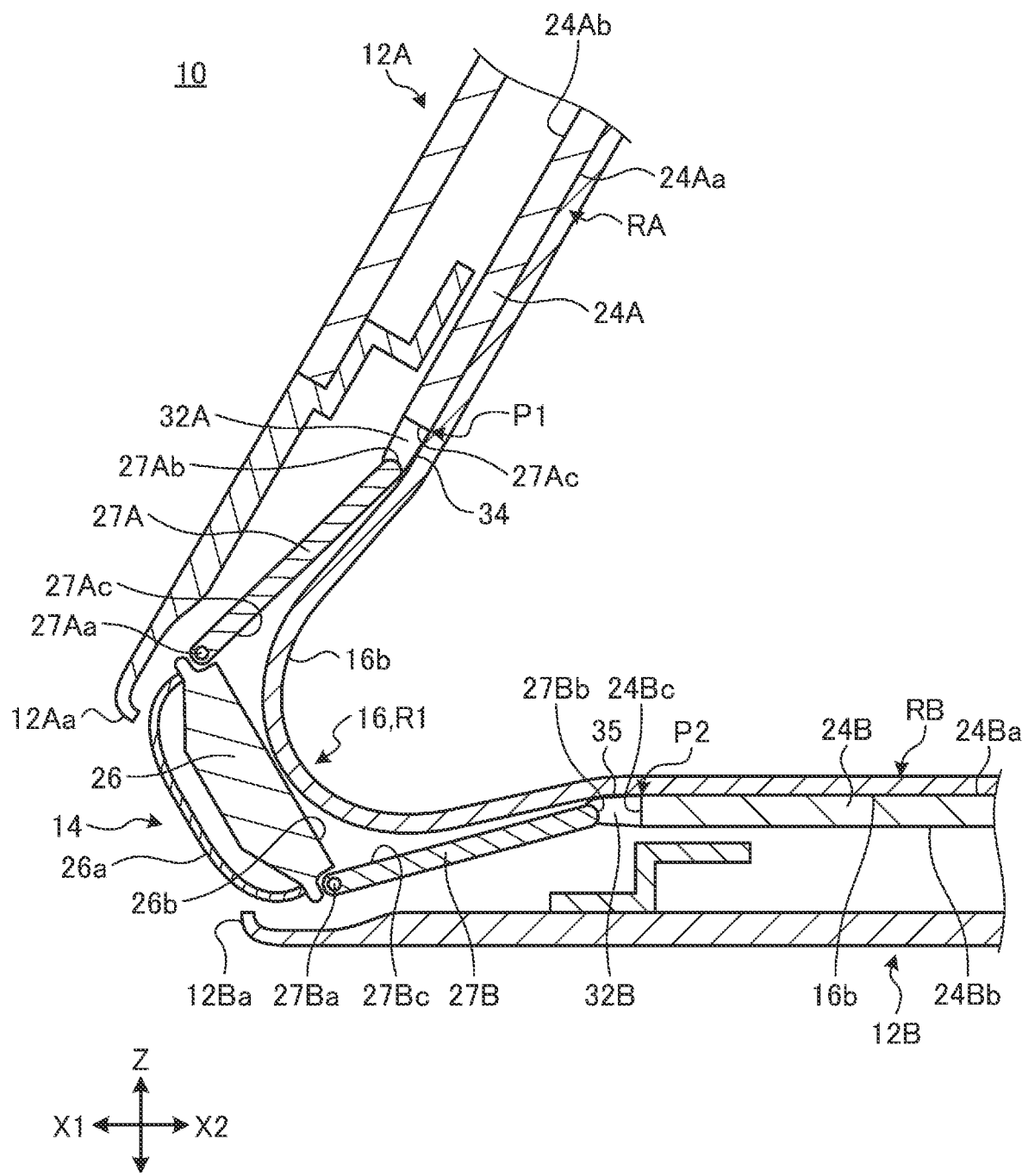
FIG. 4B is a schematic cross-sectional view of the electronic apparatus in the 60-degree posture.
Figure 4C:
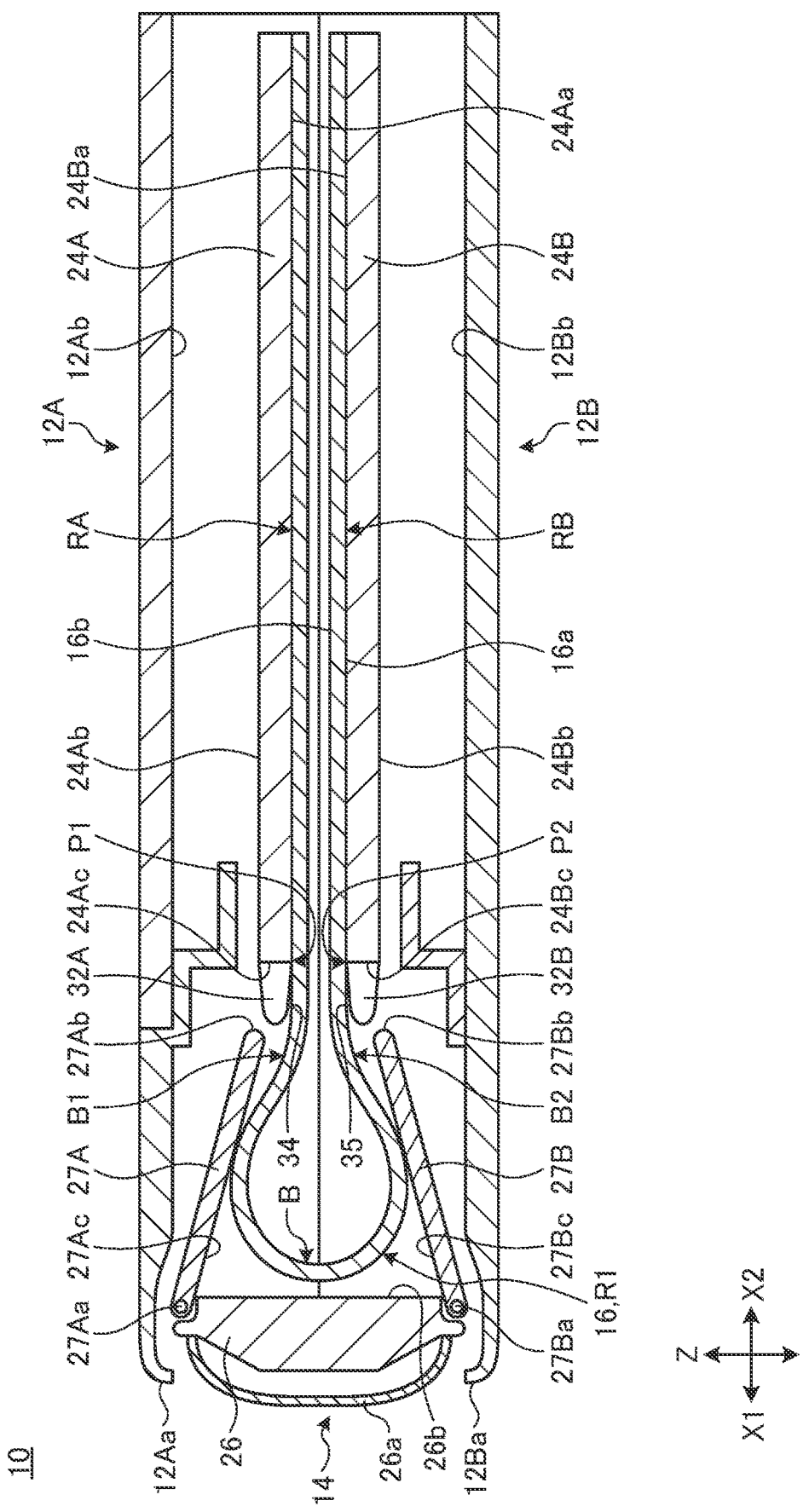
FIG. 4C is a schematic cross-sectional view of the electronic apparatus in the 0-degree posture.
Figure 5:
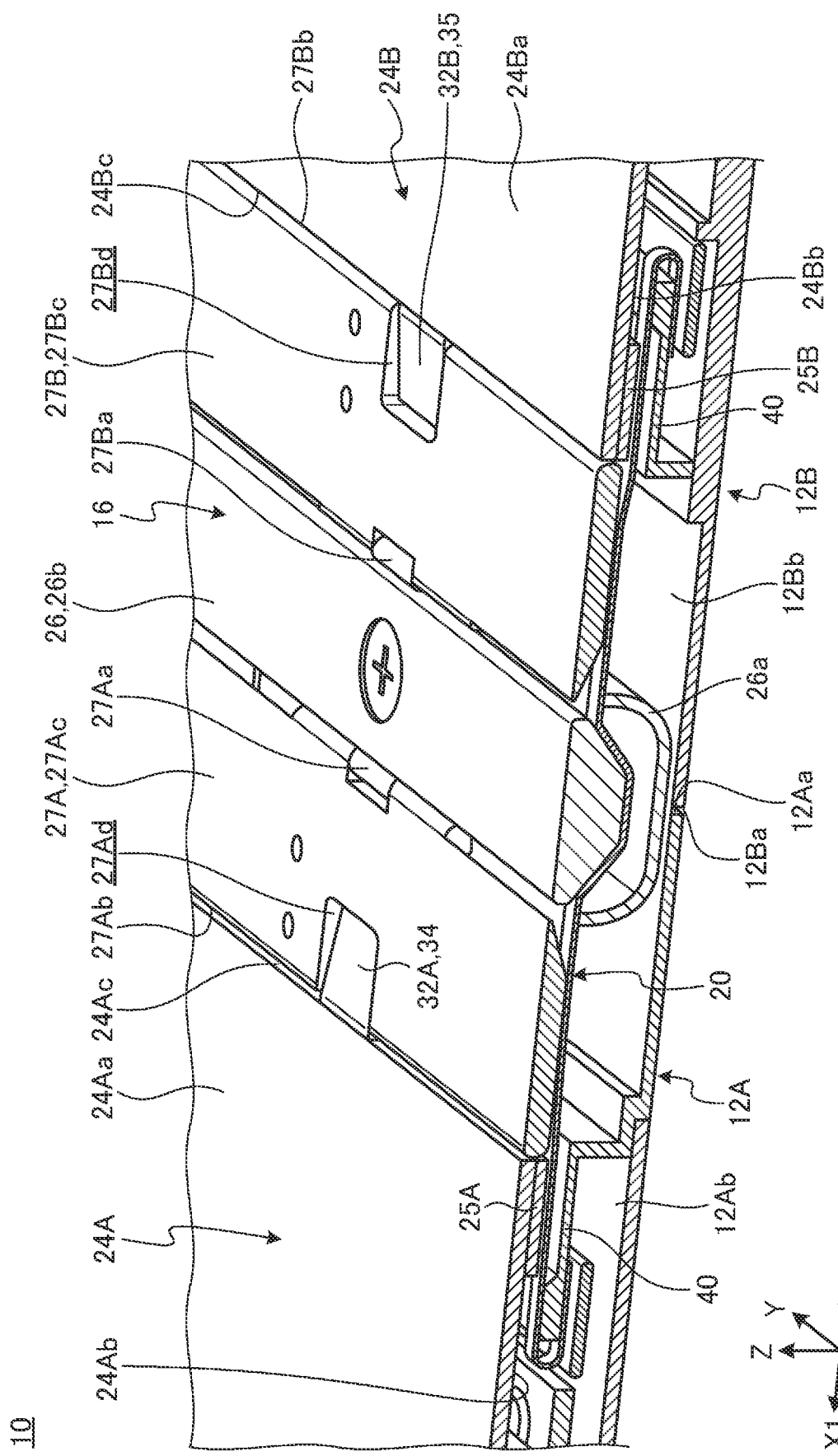
FIG. 5 is a schematic perspective cross-sectional view taken along the line V-V in FIG. 3.

FIGS. 4A, 4B, and 4C are schematic cross-sectional views of the electronic apparatus 10 in the 180-degree posture, the 60-degree posture, and the 0-degree posture, respectively. FIG. 5 is a schematic perspective cross-sectional view taken along the line V-V in FIG. 3.

As illustrated in FIGS. 4A to 5, the chassis 12A and 12B are connected via the hinge device 14 to be relatively rotatable between the 0-degree posture and the 180-degree posture. In the 0-degree posture illustrated in FIG. 4C, the chassis 12A and 12B are stacked to overlap each other in the surface normal direction. In the 180-degree posture illustrated in FIG. 4A, the chassis 12A and 12B are placed side by side in the direction (X direction) perpendicular to the surface normal direction.

As illustrated in FIGS. 4A to 4C, the display 16 is a flexible display that extends over the chassis 12A and 12B, and has a region RA in the chassis 12A and a region RB in the chassis 12B. The display 16 has a rear face 16a supported by the chassis 12A and 12B and the hinge device 14, and has a surface 16b that displays an image. The display 16 is located at the top of the chassis 12A, 12B in Z direction. In one example, the display 16 is a laminate including a front surface film, a touch panel, a display panel such as an OLED, and a back surface sheet that are stacked in order from top to bottom, and these layers are fixed with an optical clear adhesive (OCA) sheet therebetween.

In the 0-degree posture illustrated in FIG. 4C, the region RA and the region RB of the display 16 are opposed to each other, and a bending region R1 that is the boundary region between the regions RA and RB is bent in an arc shape. In the 180-degree posture illustrated in FIG. 4A, the regions RA, RB and the bending region R1 of the display 16 are placed side by side on the XY plane to have a single flat plate shape as a whole (see also FIG. 2).

In the display 16, the region RA is relatively fixed to the first chassis 12A, and the region RB is relatively fixed to the second chassis 12B. Specifically, the rear face 16a of the region RA is supported by a first plate 24A, and is fixed to the first chassis 12A via the first plate 24A. The rear face 16a of the region RB is supported by a second plate 24B, and is fixed to the second chassis 12B via the second plate 24B. The bending region R1 is movable relative to the chassis 12A and 12B.

In one example, the plates 24A and 24B are made of carbon-fiber reinforced resin. The plates 24A and 24B are placed on the left and the right of the hinge device 14, and have surfaces 24Aa and 24Ba, respectively, that are fixed to the regions RA and RB of the display 16 on the rear face 16a with double-sided tape, for example.

The plates 24A and 24B are made of carbon-fiber reinforced resin, and thus have a high degree of flatness, thinness, and light weight. For carbon-fiber reinforced resin, however, there are concerns that the carbon fiber in the powdery form may fall off from the outer end face (edge), and its shape forming and threading are also difficult. Thus, the first plate 24A has a first metal frame 25A attached to surround the outer edge of the rear face 24Ab and the outer end face (see FIGS. 3 and 5). Similarly, the second plate 24B also has a second metal frame 25B attached to surround the outer edge of the rear face 24Bb and the outer end face.

The metal frames 25A and 25B are thin frames made of a metal material such as magnesium. The plates 24A and 24B are fixed to the chassis 12A and 12B using threaded holes, for example, formed in the metal frames 25A and 25B. Note that FIGS. 4A through 4C omit the metal frames 25A and 25B, and the same applies to the drawings of FIG. 7 or later. The plates 24A and 24B may be made of a metal material or a resin material. In this case, the metal frames 25A and 25B may be omitted.

As illustrated in FIGS. 4A to 5, the hinge mechanism 14 of the present embodiment includes a hinge body 26, a first support plate 27A and a second support plate 27B.

The hinge body 26 is located across the adjacent ends 12Aa and 12Ba of the chassis 12A and 12B (see FIG. 4A), and extends along adjacent ends 12Aa and 12Ba in Y direction over substantially the entire length (see FIG. 3). The hinge body 26 is a block-like component made of metal such as aluminum.

The hinge body 26 is connected to be movable relative to a bracket fixed to the first chassis 12A via a first rotation link 28A (see FIG. 3). The hinge body 26 also is connected to be movable relative to a bracket fixed to the second chassis 12B via a second rotation link 28B (see FIG. 3). This allows the hinge body 26 to connect the chassis 12A and 12B in a relatively rotatable manner. The hinge body 26 internally includes a gear mechanism that synchronizes the rotation motions between the chassis 12A and 12B, a torque mechanism that applies a predetermined rotational torque to the rotation motions between the chassis 12A and 12B, and the like. The outer surface of the hinge body 26 is covered with a decorative cover 26a.

The support plates 27A and 27B are made of metal such as aluminum, and have a horizontally symmetrical shape. The first support plate 27A is placed to face the inner surface 12Ab of the first chassis 12A and extends along the adjacent end 12Aa over substantially the entire length in Y direction. The first support plate 27A has a X2-side end that is connected to the hinge body 26 in a relatively rotatable manner via a rotation shaft 27Aa. The first support plate 27A has a X1-side end (outer end face 27Ab) that is movable relative to the first chassis 12A, the X1-side end being adjacent to a X2-side end face 24Ac of the first plate 24A. When the electronic apparatus has the 180-degree posture, the first support plate 27A is placed between the hinge body 26 and the first plate 24A.

The second support plate 27B is placed to face the inner surface 12Bb of the second chassis 12B and extends along the adjacent end 12Ba over substantially the entire length in Y direction. The second support plate 27B has a X1-side end that is connected to the hinge body 26 in a relatively rotatable manner via a rotation shaft 27Ba. The second support plate 27B has a X2-side end (outer end face 27Bb) that is adjacent to a X1-side end face 24Bc of the second plate 24B. When the electronic apparatus has the 180-degree posture, the second support plate 27B is placed between the hinge body 26 and the second plate 24B.

As the chassis 12A and 12B rotate, the support plates 27A and 27B move relative to the inner surfaces 12Ab and 12Bb of the chassis 12A and 12B in X and Z directions. In the 180-degree posture, the surfaces of the support plates 27A and 27B support the rear face 16a of the bending region R1. In angular postures other than 180 degrees, the support plates 27A and 27B are in contact with the rear face 16a while keeping a gap from the rear face 16a or applying a small force that does not deform the display 16. The support plates 27A, 27B may be configured to support the bending region R1 of the display 16 in angular postures other than 180 degrees to correct its shape. In this way, the support plates 27A, 27B stably support the bending region R1 of the display 16 with a plane when the electronic apparatus has the 180-degree posture, while not interfering with the bending motion of the bending region R1.

When the electronic apparatus has the 180-degree posture illustrated in FIG. 4A, the support plates 24A and 24B, the hinge body 26, and the support plates 27A and 27B are placed side by side in X direction. The surfaces 24Aa, 24Ba, 26b, 27Ac, and 27Bc of these members are placed on the same XY plane to define a plane as a whole. The rear face 16a of the display 16 is supported on this flat plate to be a single flat large screen. In FIG. 2, reference numeral 30 denotes a bezel member, which is a frame-like cover covering an inactive region at the periphery of the surface 16b of the display 16.

In the 0-degree posture illustrated in FIG. 4C, the chassis 12A and 12B are stacked so that their surface normal directions are substantially parallel to each other, and have a folded state being excellent in design. In this state, the bending region R1 of the display 16 is curved with a predetermined curvature and swells like a bag in cross section in side view. This bending shape may be also called a bell shape or a teardrop shape other than the bag shape. In this way, the display 16 has the bending region R1 that is bent with a desired curvature by the plates 24A and 24B that are stacked in parallel having a predetermined gap therebetween. As a result, the chassis 12A and 12B of the electronic apparatus 10 can be made as thin as possible. This also suppresses a breakage of the display 16 during bending. Note that the bending region R1 illustrated in FIG. 4C has the width (outer diameter of the swelling) in Z direction of the bag-like bending shape that is larger than at least the Z-direction distance between the surfaces 24Aa and 24Ba of the plates 24A and 24B. With this configuration, the electronic apparatus 10 keeps the distance between the stacked plates 24A and 24B to the minimum to suppress the thickness of the chassis as a whole while having an enough radius of curvature of the bending portion (inward bending portion B) of the display 16.

In the side view illustrated in FIGS. 4A to 4C, the bending region R1 of the display 16 has a freely movable region between a first fixed point P1 on the X1 side and a second fixed point P2 on the X2 side. In one example, the first fixed point P1 is the edge between the surface 24Aa and the end face 24Ac of the first plate 24A. In one example, the second fixed point P2 is the edge between the surface 24Ba and the end face 24Bc of the second plate 24B. That is, the bending region R1 is in a substantially free state except for the 180-degree posture in which the entire rear face 16a is supported. As a result, in the 0-degree posture illustrated in FIG. 4C, the display 16 has a first outward bending portion B1, an inward bending portion B, and a second outward bending portion B2 in the order from the first fixed point P1 to the second fixed point P2, thus having a bag shape or a bell shape. Experiments showed that if the radius of curvature of these outward bending portions B1 and B2 is too small, the shear stress concentrates on this part, which leads to a concern that the display 16 may cause delamination.

Figure 6:
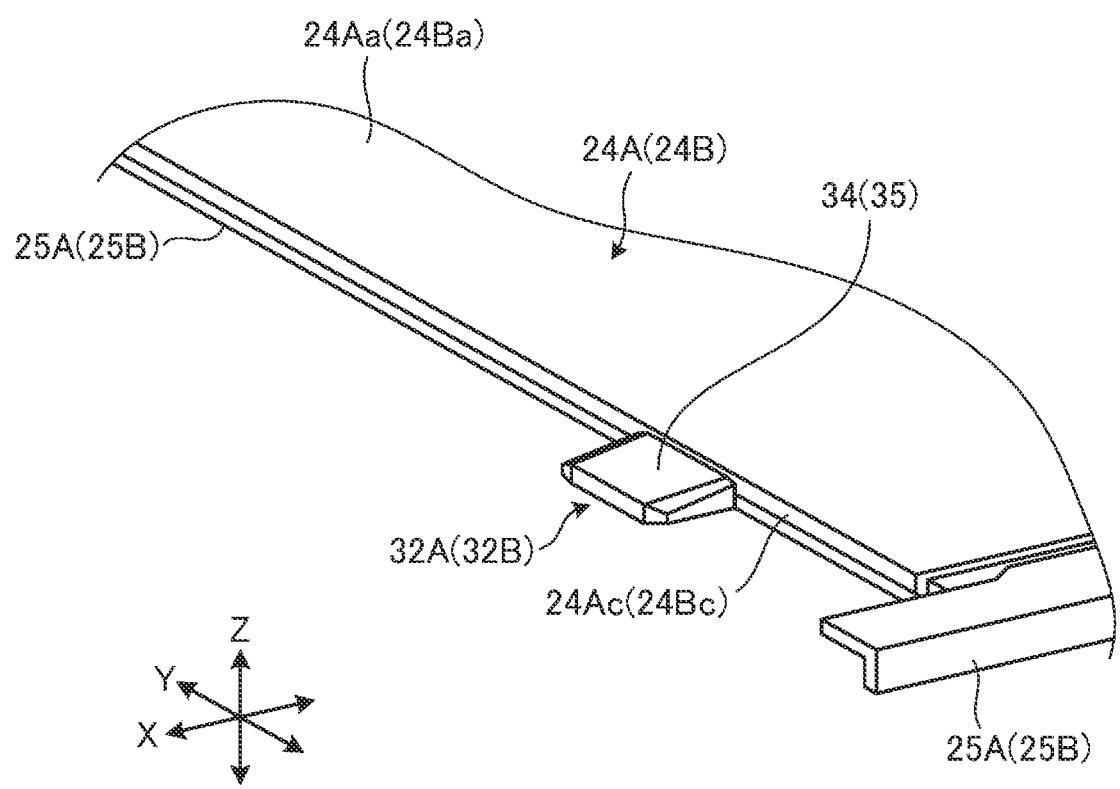
FIG. 6 is an enlarged perspective view of the end face of the first plate and its periphery.

Next, the following describes the configuration to increase the radius of curvature of the outward bending portions B1 and B2. FIG. 6 is an enlarged perspective view of the end face 24Ac of the first plate 24A and its periphery. The configuration of the end face 24Bc of the second plate 24B and its periphery has the same structure as that of the first plate 24A illustrated in FIG. 6 except that it is horizontally symmetrical. FIG. 6 therefore gives the reference numerals in parentheses to omit their detailed illustration.

As illustrated in FIGS. 5 and 6, the electronic apparatus 10 includes a first protruding piece 32A and a second protruding piece 32B.

The first protruding piece 32A is a claw-shaped piece of plate protruding in X2 direction from the end face 24Ac of the first plate 24A. A plurality of (six in FIG. 3) these first protruding pieces 32A is aligned along Y direction. In one example, these first protruding pieces 32A are placed at the metal frame 25A to be fixed integrally with the first plate 24. In one example, the protruding length of these first protruding pieces 32A is about half of the width of the first support plate 27A in X direction (see FIGS. 3 and 5).

Each first protruding piece 32A has a first inclined face 34 that is the top face. This first inclined face 34 is inclined gradually in the protruding direction (X2 direction) of the first protruding piece 32A. The first inclined face 34 is flush or substantially flush with the surface 24Aa of the first plate 24A at the proximal end and is gradually inclined down from the surface 24Aa toward the distal end. This means that the first inclined face 34 is inclined gradually down from the surface 24Aa of the first plate 24 toward the distal end (see FIG. 4C). In other words, the first inclined face 34 descends to the front, that is, is inclined gradually from the surface 24Aa to the rear face 24Ab toward the distal end.

The second protruding piece 32B has the same structure as the first protruding piece 32A except that it is horizontally symmetrical. The second protruding piece 32B protrudes in X1 direction from the end face 24Bc of the second plate 24B. Similarly, a plurality of (six in FIG. 3) these second protruding pieces 32B is aligned along Y direction, and their protruding length is about half of the width of the second support plate 27B in X direction. These second protruding pieces 32B also are placed at the metal frame 25B to be fixed integrally with the second plate 25. Each second protruding piece 32B has a second inclined face 35 that is the top face, and the second inclined face 35 is inclined gradually down from the surface 25Aa of the second plate 25 in the protruding direction (X1 direction) of the second protruding piece 32B. In other words, the second inclined face 35 descends to the front, that is, is inclined gradually from the surface 25Aa to the rear face 25Ab toward the distal end. With this configuration, in the 0-degree posture illustrated in FIG. 4C, the distance between the inclined faces 34 and 35 widens toward the distal ends in a trumpet shape.

In the 180-degree posture illustrated in FIG. 4A, the end face 24Ac of the first plate 24A comes in contact with or is close to the outer end face 27Ab of the first support plate 27A. Similarly, the end face 24Bc of the second plate 24B comes in contact with or is close to the outer end face 27Bb of the second support plate 27B. The outer end faces 27Ab and 27Bb of the support plates 27A and 27B have recesses 27Ad and 27Bd like cutouts, respectively. These recesses 27Ad and 27Bd are clearance for avoiding interference with the protruding pieces 32A and 32B, and are located at positions corresponding to the protruding pieces 32A and 32B (see FIGS. 3 and 5).

The display 16 overlaps the inclined faces 34 and 35 at the bending region R1. This means that the rear face 16a of the display 16 is not fixed to the inclined faces 34 and 35, and is freely movable. The protruding pieces 32A and 32B are round chamfered at the tip ends to prevent them from getting caught in the display 16.

Figure 7:
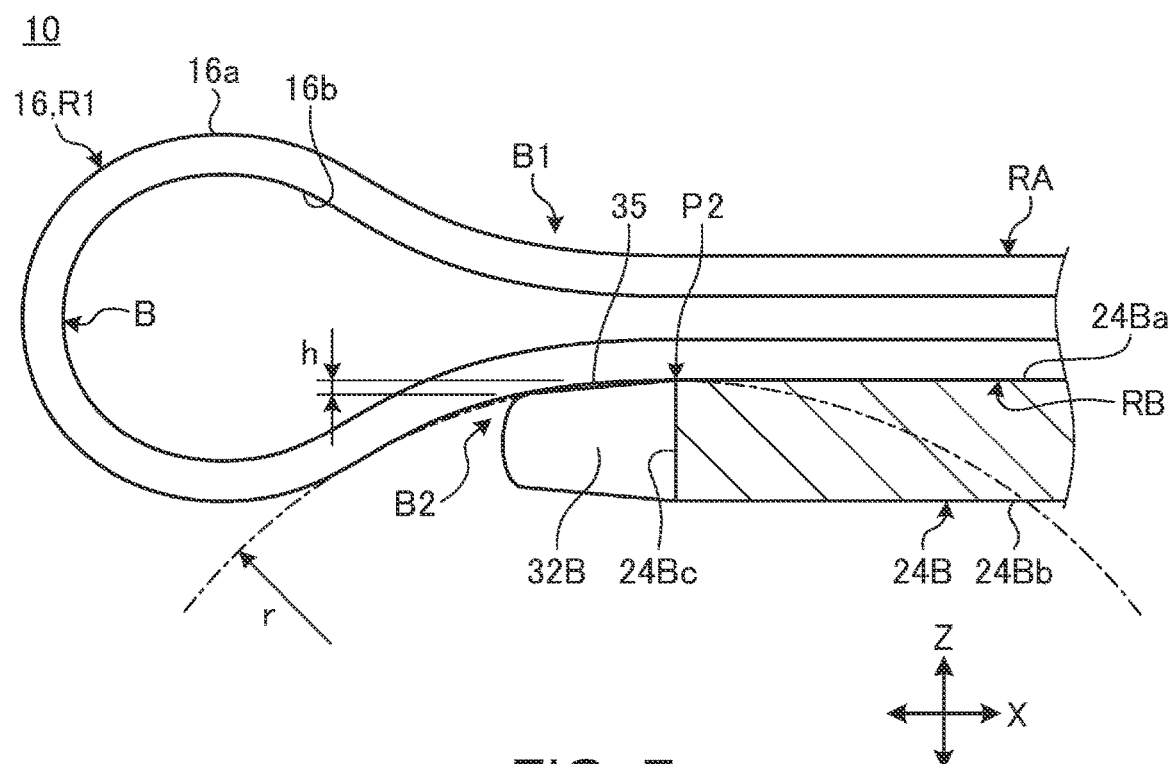
FIG. 7 is a schematic cross-sectional view of the bending region when the electronic apparatus according to the present embodiment has the 0-degree posture.
Figure 8:
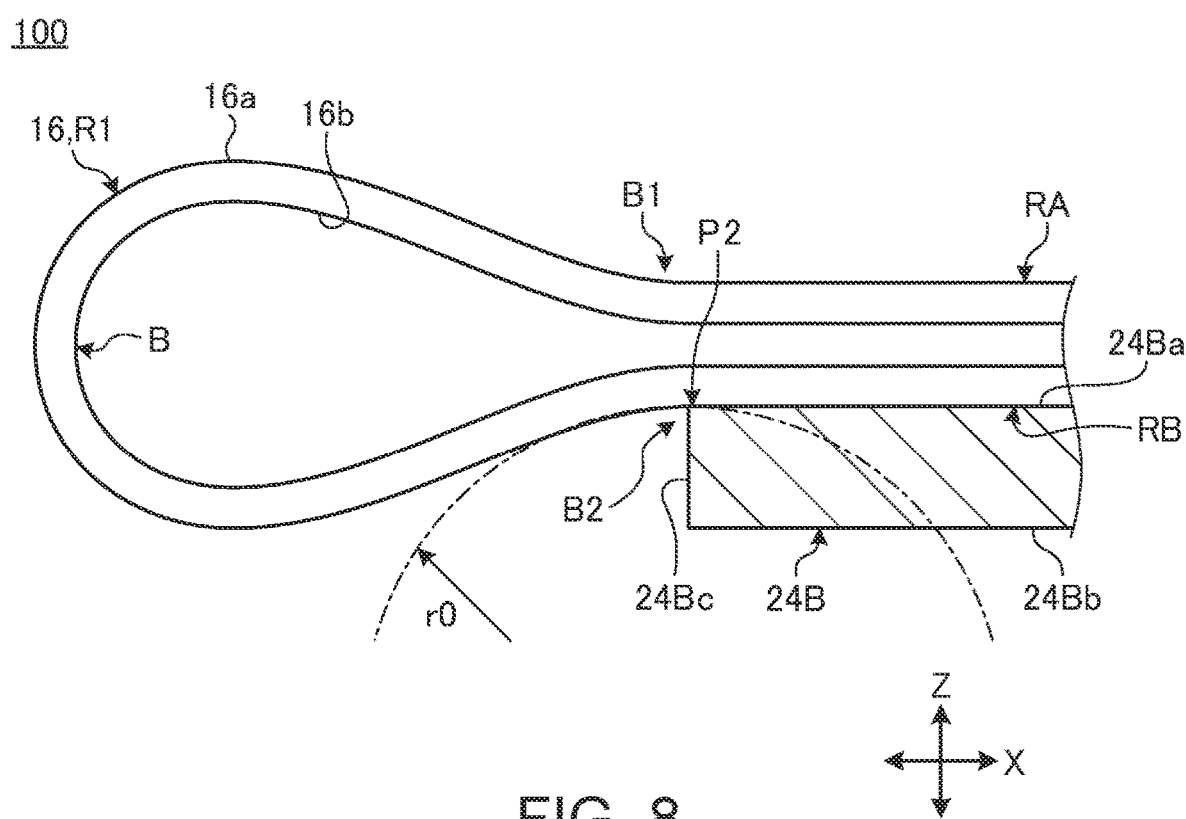
FIG. 8 is a schematic cross-sectional view of the bending region when the electronic apparatus according to a comparative example has the 0-degree posture.

FIG. 7 is a schematic cross-sectional view of the bending region R1 when the electronic apparatus 10 according to the present embodiment has the 0-degree posture. FIG. 8 is a schematic cross-sectional view of the bending region R1 when an electronic apparatus 100 according to a comparative example has the 0-degree posture. FIG. 8 illustrates the configuration of FIG. 7 without the protruding piece 32A (32B). The configuration of the first plate 24A and its periphery has the same or substantially the same structure as that of the second plate 24B and its periphery illustrated in FIGS. 7 and 8 except that it is vertically symmetrical. For easy understanding of the drawings, FIGS. 7 and 8 illustrate only the second plate 24B and omit the first plate 24A.

Firstly, the following describes the bending state of the display 16 of the electronic apparatus 100 that is a comparative example illustrated in FIG. 8. In this case, the portion of the display 16 from the second fixed point P2 to the inward bending portion B is supported only at the end face 24Bc. The portion of the display 16 protruding from the end face 24Bc toward the inward bending portion B therefore is lowered (outward). That is, the second outward bending portion B2 in this portion has a slightly curved bending shape after being pressed by the edge of the end face 24Bc. As a result, the radius of curvature r0 of the second outward bending portion B2 is, for example, about 7 mm. The first outward bending portion B1 has a substantially vertically symmetrical shape with the second outward bending portion B2, and has the same or substantially the same radius of curvature as r0.

Next, the following describes the bending state of the display 16 of the electronic apparatus 10 according to the present embodiment illustrated in FIG. 7. In this case, the portion of the display 16 from the second fixed point P2 to the inward bending portion B is supported at the end face 24Bc and the second inclined face 35. The portion of the display 16 protruding from the end face 24Bc toward the inward bending portion B therefore is supported at the second inclined face 35 and thus swells gently downward (outward). That is, the second outward bending portion B2 in this portion has a gently curved bending shape along the second inclined face 35. As a result, the radius of curvature r of the second outward bending portion B2 is, for example, about 20 mm, which is larger than the radius of curvature of FIG. 8. The first outward bending portion B1 has a substantially vertically symmetrical shape with the second outward bending portion B2, and has the same or substantially the same radius of curvature as r. As the radius of curvature r of the second outward bending portion B2 increases, the radius of curvature of the inward bending portion B correspondingly decreases. The same applies to the relationship between the first outward bending portion B1 and the inward bending portion B. Then, the distance between the fixed points P1 and P2 may be set to be slightly larger than that of the example of FIG. 8, and in addition to or instead of this, the X-direction position of the fixed points P1 and P2 may be changed slightly in the direction away from the inward bending portion B. This keeps the radius of curvature of the inward bending portion B to be a predetermined value (e.g., 3 mm) or more. Note here that FIG. 7 does not illustrate the effect on the inward bending portion B for simplicity and to clearly show the contrast of the outward bending portions B1 and B2 with the configuration in FIG. 8.

As illustrated in FIG. 7, the second inclined face 35 has the proximal end substantially flush with the surface 24Ba in the protruding direction from the end face 24Bc of the second plate 24B, and the distal end that is lower by a height h from the end face 24Bc. In one example, the electronic apparatus 10 of the present embodiment is a tablet PC or laptop PC with a 13 to 14 inch display 16. For such specifications, the height h preferably is about 0.2 to 0.8 mm, for example, and in this embodiment, the height is 0.6 mm. Preferably, the radius of curvature r is set to 20 mm or more, and the inclination angle and height h of the second inclined face 35 can be set to values that enable this radius of curvature. The first inclined face 34 may be vertically symmetrical with the second inclined face 35 in FIG. 7. The inclined faces 34 and 35 do not have to be flat, and may be a curved face having a radius of curvature similar to the radius of curvature r, for example.

As stated above, the electronic apparatus 10 according to the present embodiment has the radius of curvature r of the outward bending portions B1 and B2 that is significantly larger than that of the electronic apparatus 100 according to the comparative example without the inclined faces 34 and 35. The electronic apparatus 10 having this configuration suppresses delamination of the display 16 during bending, and thus suppresses problems.

Figure 9A:
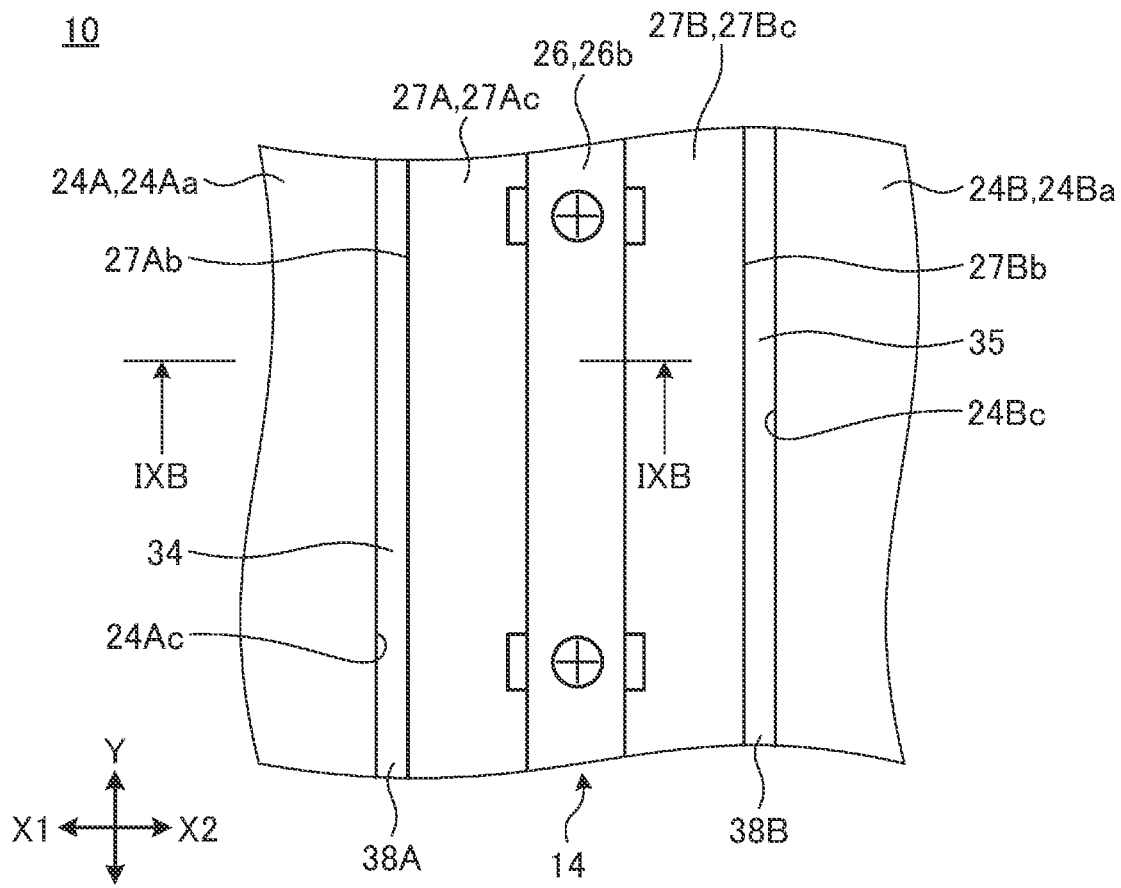
FIG. 9A is a schematic enlarged plan view of the major parts of the electronic apparatus including protruding pieces according to a modified example when the electronic apparatus has the 180-degree posture.
Figure 9B:
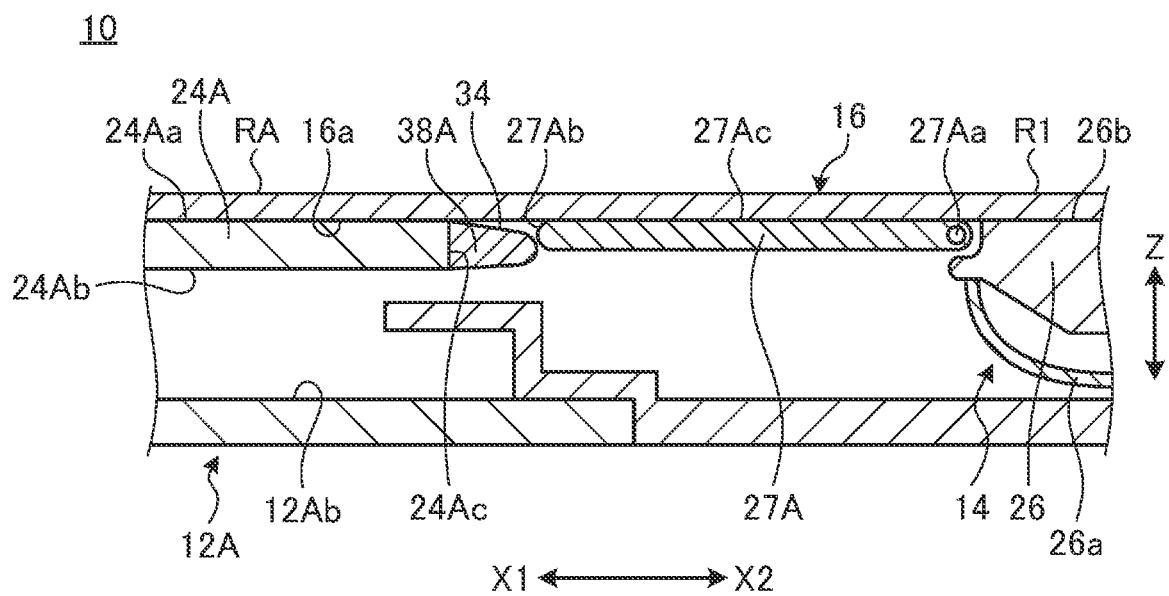
FIG. 9B is a schematic cross-sectional view taken along the line IXB-IXB in FIG. 9A.

FIG. 9A is a schematic enlarged plan view of the electronic apparatus 10 including protruding pieces 38A and 38B that are different in configuration from the protruding pieces 32A and 32B when the electronic apparatus 10 has the 180-degree posture. FIG. 9B is a schematic cross-sectional view taken along the line IXB-IXB in FIG. 9A.

As illustrated in FIGS. 9A and 9B, this embodiment includes the protruding pieces 38A and 38B instead of the above-mentioned protruding pieces 32A and 32B. The first protruding piece 38A has a structure such that the first protruding piece 32A is substantially extended over the entire length in Y direction of the end face 24Ac of the first plate 24A. This means that the first protruding piece 38A is a belt-like plate having a first inclined face 34 that is the top face and extending along the end face 24Ac. The first protruding piece 38A is placed between the end face 24Ac and the outer end face 27Ab of the first support plate 27A. In the 180-degree posture, the distal end face of the first protruding piece 38A comes in contact with or is close to the outer end face 27Ab of the first support plate 27A. That is, the first protruding piece 38A is located between the end face 24Ac and the outer end face 27Ab, so that this embodiment does not require the recess 27Ad of the first support plate 27A.

The configuration of the second protruding piece 38B and its periphery is the same or substantially the same as that of the first protruding piece 38A and its periphery illustrated in FIG. 9B except that it is horizontally symmetrical. That is, the second protruding piece 38B also extends over the entire length in Y direction of the end face 24Bc of the second plate 24B, and has a second inclined face 35 that is the top face.

As illustrated in FIG. 9B, similarly to the configuration including the protruding pieces 32A and 32B, the electronic apparatus 10 including these protruding pieces 38A and 38B also has the effect of increasing the radius of curvature r of the outward bending portions B1 and B2 from the inclined faces 34 and 35.

The protruding pieces 38A and 38B, however, extend along Y direction. Therefore, when the electronic apparatus has the 180-degree posture, a step is formed between the surfaces 24Aa and 24Ba and the surfaces 27Ac and 27Bc due to the inclined faces 34 and 35. This step extends over the entire length in Y direction, which may cause a user to feel discomfort when they touch the display 16. In contrast, the above-mentioned protruding pieces 32A and 32B have the advantage that the discomfort during touching is even smaller, because the steps are formed only partially in Y direction due to the inclined faces 34 and 35.

Note that the inclined faces 34 and 35 of the protruding pieces 38A and 38B support the outward bending portions B1 and B2 of the display 16 over substantially the entire length in Y direction. This configuration therefore has an advantage of forming the shape of the outward bending portions B1 and B2 more stably than in the configuration including the protruding pieces 32A and 32B.

Figure 10:
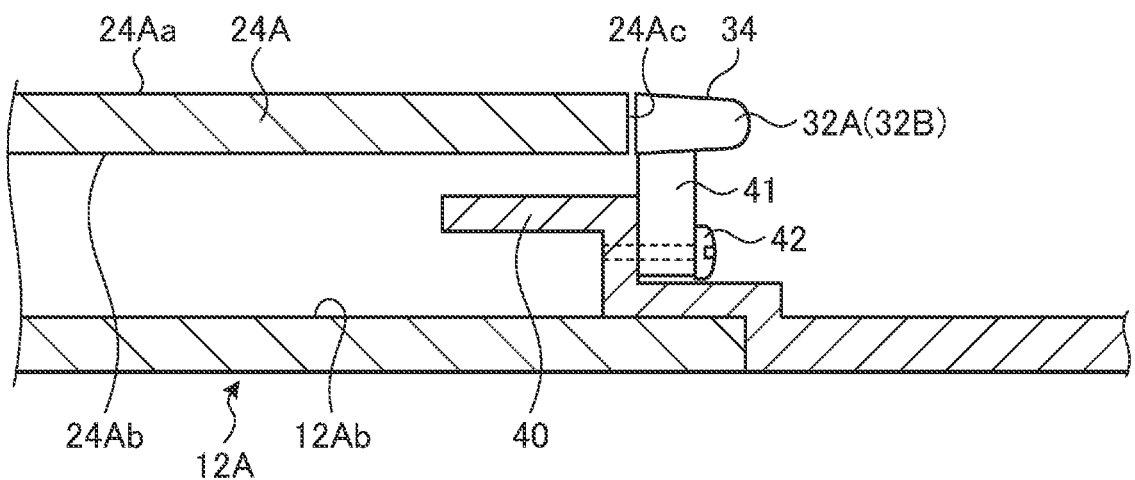
FIG. 10 is a schematic cross-sectional view of the electronic apparatus including the protruding pieces that are attached according to a modified example.

FIG. 10 is a schematic cross-sectional view of the electronic apparatus 10 including the protruding pieces 32A and 32B that are attached according to a modified example. FIG. 10 illustrates only the configuration of the first protruding piece 32A and its periphery, and the configuration of the second protruding piece 32B and its periphery is the same as or similar to that illustrated in FIG. 10 except that it is horizontally symmetrical.

As illustrated in FIG. 10, the protruding pieces 32A and 32B may be directly attached to the chassis 12A and 12B instead of to the plates 24A and 24B. The chassis 12A (12B) of the present embodiment has a rising piece 40 protruding from the inner surface 12Ab (12Bb). The protruding piece 32A (32B) includes a support piece 41 protruding downward from the lower surface, for example. Then, the protruding piece 32A (32B) may be fixed to the chassis 12A (12B) by fixing the support piece 41 to the rising piece 40 with a screw 42, for example. Note that the protruding pieces 38A and 38B illustrated in FIGS. 9A and 9B may also be fixed to the chassis 12A and 12B with the same mounting structure as that illustrated in FIG. 10.

In the configuration illustrated in FIG. 10, however, the plates 24A and 24B and the protruding pieces 32A and 32B are separate. This configuration therefore may lead to the displacement in positional relationship between the surfaces 24Aa and 24Ba and the inclined faces 34 and 35 in Z and X directions. In contrast, in the configuration illustrated in FIG. 4A and others, the protruding pieces 32A and 32B are integrally fixed to the plates 24A and 24B. This configuration therefore leads to the advantages of enabling easy and accurate positioning of the surfaces 24Aa and 24Ba and the inclined faces 34 and 35 in Z direction and X direction, and being easily controllable about the radius of curvature r of the outward bending portions B1 and B2.

The present disclosure is not limited to the above-described embodiments, and can be modified freely without deviating from the scope of the present disclosure.

The above describes the protruding pieces 32A, 32B, 38A, 38B that are components to be fixed to the plates 24A, 24B or to the chassis 12A, 12B. In another embodiment, the protruding pieces 32A, 32B, 38A, 38B may be integrally formed with the plates 24A, 24B or the metal frames 25A, 25B.

The above describes the electronic apparatus 10 that is foldable into half like a book as an example. Other than the configuration of folding the chassis of the same shape double, the present disclosure is applicable to various configurations including: a double door configuration in which small chassis are foldably connected to the left and right edges of a large chassis; an S-shaped folding configuration in which chassis with different folding directions are connected to the left and right edges of a single chassis; and a J-shaped folding configuration in which a small chassis is foldably connected to one of the left and right edges of a large chassis. The number of connected chassis may be four or more.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:
1. An electronic apparatus comprising:
a first chassis;
a second chassis adjacent to the first chassis;
a hinge device configured to connect the first chassis and the second chassis in a relatively rotatable manner between a first posture where the first chassis and the second chassis are stacked to overlap each other in their surface normal directions and a second posture where the first chassis and the second chassis are placed side by side in the direction perpendicular to the surface normal directions;
a display that extends over the first chassis and the second chassis, and has a bending region that is bent together with a relative rotation between the first chassis and the second chassis;
a first plate disposed to face an inner surface of the first chassis, the first plate having a surface, to which a rear face of the display at a region close to the first chassis relative to the bending region is fixed;
at least one first protruding piece protruding from an end face of the first plate;
a second plate disposed to face an inner surface of the second chassis, the second plate having a surface, to which a rear face of the display at a region close to the second chassis relative to the bending region is fixed; and at least one second protruding piece protruding from an end face of the second plate, wherein in the first posture, the bending region of the display having a bag-shaped bending shape in cross section that protrudes from the end faces of the first plate and the second plate disposed to overlap each other, the electronic apparatus further includes:

a first inclined face protruding from the end face of the first plate to be inclined gradually downward from the surface of the first plate in the protruding direction; and a second inclined face protruding from the end face of the second plate to be inclined gradually downward from the surface of the second plate in the protruding direction, the at least one first protruding piece has the first inclined face, and the at least one second protruding piece has the second inclined face.

2. The electronic apparatus according to claim 1, wherein the at least one first protruding piece is fixed to the first plate, and the at least one second protruding piece is fixed to the second plate.

3. The electronic apparatus according to claim 1, wherein the at least one first protruding piece includes a plurality of first protruding pieces that are aligned in a longitudinal direction of the end face of the first plate, and the at least one second protruding piece includes a plurality of second protruding pieces that are aligned in a longitudinal direction of the end face of the second plate.

4. The electronic apparatus according to claim 3, wherein the hinge device comprises:

a hinge body extending along adjacent ends of the first chassis and the second chassis to be located across the adjacent ends, the hinge body supporting the rear face of the display;

a first support plate disposed to face the inner surface of the first chassis and extending along the adjacent ends, the first support plate connecting to the hinge body in a relatively rotatable manner, and supporting the rear face of the display between the hinge body and the first plate; and a second support plate disposed to face the inner surface of the second chassis and extending along the adjacent ends, the second support plate connecting to the hinge body in a relatively rotatable manner, and supporting the rear face of the display between the hinge body and the second plate, wherein in the second posture, the first support plate has an outer end face on the other side of the hinge body, the outer end face coming in contact with or being close to the end face of the first plate, in the second posture, the second support plate has an outer end face on the other side of the hinge body, the outer end face coming in contact with or being close to the end face of the second plate, the outer end face of the first support plate has a recess like a cutout to avoid interference with the at least one first protruding piece, and the outer end face of the second support plate has a recess like a cutout to avoid interference with the at least one second protruding piece.

5. The electronic apparatus according to claim 1, wherein the at least one first protruding piece extends in a longitudinal direction of the end face of the first plate, and the at least one second protruding piece extends in the longitudinal direction of the end face of the second plate.

6. The electronic apparatus according to claim 5, wherein the hinge device comprises:

a hinge body extending along adjacent ends of the first chassis and the second chassis to be located across the adjacent ends, the hinge body supporting the rear face of the display;

a first support plate disposed to face the inner surface of the first chassis and extending along the adjacent ends, the first support plate connecting to the hinge body in a relatively rotatable manner, and supporting the rear face of the display between the hinge body and the first plate; and a second support plate disposed to face the inner surface of the second chassis and extending along the adjacent ends, the second support plate connecting to the hinge body in a relatively rotatable manner, and supporting the rear face of the display between the hinge body and the second plate, wherein in the second posture, the first support plate has an outer end face on the other side of the hinge body, the outer end face coming in contact with or being close to a distal end face of the at least one first protruding piece, and in the second posture, the second support plate has an outer end face on the other side of the hinge body, the outer end face coming in contact with or being close to a distal end face of the at least one second protruding piece.

* * * * *